(12) United States Patent
Ha et al.

(10) Patent No.: US 11,775,008 B2
(45) Date of Patent: *Oct. 3, 2023

(54) FOLDABLE DISPLAY DEVICE

(71) Applicant: Samsung Display Co., Ltd., Yongin-si (KR)

(72) Inventors: Seung Hwa Ha, Hwaseong-si (KR); Sang Jae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 173 days.

This patent is subject to a terminal disclaimer.

(21) Appl. No.: 17/164,087

(22) Filed: Feb. 1, 2021

(65) Prior Publication Data

US 2021/0247804 A1 Aug. 12, 2021

(30) Foreign Application Priority Data

Feb. 7, 2020 (KR) ........................ 10-2020-0014889

(51) Int. Cl.
| | | |
|---|---|---|
| *B32B 7/12* | (2006.01) | |
| *G06F 1/16* | (2006.01) | |
| *B32B 7/022* | (2019.01) | |
| *B32B 3/18* | (2006.01) | |
| *B32B 3/30* | (2006.01) | |

(52) U.S. Cl.
CPC ............ *G06F 1/1616* (2013.01); *B32B 7/022* (2019.01); *G06F 1/1626* (2013.01); *B32B 3/18* (2013.01); *B32B 3/30* (2013.01); *B32B 2307/51* (2013.01); *B32B 2457/20* (2013.01)

(58) Field of Classification Search
CPC .............. B32B 7/022; B32B 3/18; B32B 3/30
See application file for complete search history.

(56) References Cited

U.S. PATENT DOCUMENTS

| | | | |
|---|---|---|---|
| 8,144,133 B2 | 3/2012 | Wang et al. | |
| 9,354,476 B2 | 5/2016 | Han et al. | |
| 10,657,850 B2 | 5/2020 | Kim | |
| 2015/0043174 A1 | 2/2015 | Han et al. | |
| 2019/0251876 A1 | 8/2019 | Kim | |
| 2021/0251090 A1* | 8/2021 | Ha | H05K 5/0017 |
| 2022/0043187 A1* | 2/2022 | Choi | H04M 1/0268 |
| 2022/0198964 A1* | 6/2022 | Cho | G06F 1/1652 |

FOREIGN PATENT DOCUMENTS

| | | |
|---|---|---|
| KR | 10-2015-0017819 | 2/2015 |
| KR | 10-2019-0003257 | 1/2019 |
| KR | 10-2019-0080740 | 7/2019 |
| KR | 10-2019-0098309 | 8/2019 |

* cited by examiner

*Primary Examiner* — Elizabeth E Mulvaney
(74) *Attorney, Agent, or Firm* — H.C. Park & Associates, PLC

(57) ABSTRACT

A foldable display device includes: a display panel; a window disposed on the display panel; and a functional member having an elastic modulus and being disposed between the display panel and the window or at least partially on the window, the functional member including a plurality of first discontinuities having a greater elastic modulus than the elastic modulus of the first functional member.

20 Claims, 10 Drawing Sheets

FOLDABLE DISPLAY DEVICE

CROSS-REFERENCE TO RELATED APPLICATION(S)

This application claims priority from and the benefit of Korean Patent Application No. 10-2020-0014889, filed on Feb. 7, 2020, which is incorporated by reference for all purposes as if fully set forth herein.

BACKGROUND

Field

Exemplary embodiments of the invention relate to a display device, and more particularly, to a foldable display device.

Discussion of the Background

A display device may provide information to a user by displaying an image. Recently, a flexible display device deformable in various forms has been developed. Unlike a flat panel display, the flexible display device may be folded, bent, or rolled like a paper. The flexible display device can be portable and can improve convenience of the user.

The foldable display device may include a display panel for generating an image and a plurality of layers disposed on the display panel to provide various functions to the display panel.

The above information disclosed in this Background section is only for understanding of the background of the inventive concepts, and, therefore, it may contain information that does not constitute prior art.

SUMMARY

Applicant realized that when the layers of the display panel are folded repeatedly with the display panel in normal use of the foldable display device, buckling of the layers or delamination between the layers of the display panel may occur.

Folded display devices constructed according to the principles and exemplary implementations of the invention include a functional member that minimizes the occurrence of buckling or delamination of the layers in a display panel. For example, the functional member may include a plurality of first discontinuities having a greater elastic modulus than the elastic modulus of the first functional member. Accordingly, although the foldable display device is repeatedly folded, buckling of the functional member and delamination between the functional member and a layer adjacent thereto may not occur.

Additional features of the inventive concepts will be set forth in the description which follows, and in part will be apparent from the description, or may be learned by practice of the inventive concepts.

According to one aspect of the invention, a foldable display device includes: a display panel; a window disposed on the display panel; and a functional member having an elastic modulus and being disposed between the display panel and the window or at least partially on the window, the functional member including a plurality of first discontinuities having a greater elastic modulus than the elastic modulus of the first functional member.

The elastic modulus of the functional member may be less than about 1 GPa, wherein the elastic modulus of the first discontinuities may be greater than or equal to about 1 GPa.

At least one of the functional member and the first discontinuities may include a light transmitting material.

The functional member may include at least one of a polyamide and a polyurethane.

The first discontinuities may include poly(methyl methacrylate).

The first discontinuities may include first holes having a material therein.

The first holes may have a generally circular shape in a plan view with a diameter ranging from about 4 µm to about 100 µm.

At least some of the first holes may have a generally trapezoidal shape in a cross-sectional view.

At least some of the first discontinuities may include through holes passing through the functional member.

At least some of the first discontinuities may include recessed holes extending from a surface of the functional member.

The display panel may include a first non-bendable portion, a second non-bendable portion, and a bendable portion between the first non-bendable portion and the second non-bendable portion, and wherein the first discontinuities may overlap the first non-bendable portion, the second non-bendable portion, and the bendable portion.

The functional member may further include a first functional layer having the first discontinuities, a second functional layer having an elastic modulus and being at least partially disposed on the first functional layer, the second functional layer having a plurality of second discontinuities, and a third functional layer disposed between the first functional layer and the second functional layer, and wherein the second discontinuities may have an elastic modulus greater than the elastic modulus of the second functional layer.

The third functional layer may have an elastic modulus greater than the elastic modulus of the first functional layer and the elastic modulus of the second functional layer.

The plurality of third discontinuities may be formed in the third functional layer, the third discontinuities having an elastic modulus greater than an elastic modulus of the third functional layer.

The third functional layer may include a polyimide.

The functional member may further include a first functional layer having the first discontinuities, a second functional layer having an elastic modulus and being at least partially disposed on a first surface of the first functional layer and a third functional layer having an elastic modulus and being at least partially disposed on a second surface of the first functional layer opposite to the first surface, and wherein the elastic modulus of the second functional layer and the elastic modulus of the third functional layer may be greater than the elastic modulus of the first functional layer.

The plurality of second discontinuities having an elastic modulus and a plurality of third discontinuities having an elastic modulus may be respectively disposed in the second functional layer and the third functional layer, wherein the elastic modulus of the second discontinuities and the elastic modulus of the third discontinuities may be greater than the elastic modulus of the second functional layer and the elastic modulus of the third functional layer, respectively.

The functional member may include an impact absorbing layer disposed between the display panel and the window.

The functional member may include a protective layer disposed on the window.

According to another aspect of the invention, a foldable display device includes: a display panel; a window disposed on the display panel; and a functional member having an elastic modulus and being disposed between the display panel and the window or on the window, the functional member having a plurality of holes and a filler disposed in at least some of the holes, wherein the filler has an elastic modulus smaller than that of the elastic modulus of the functional member.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
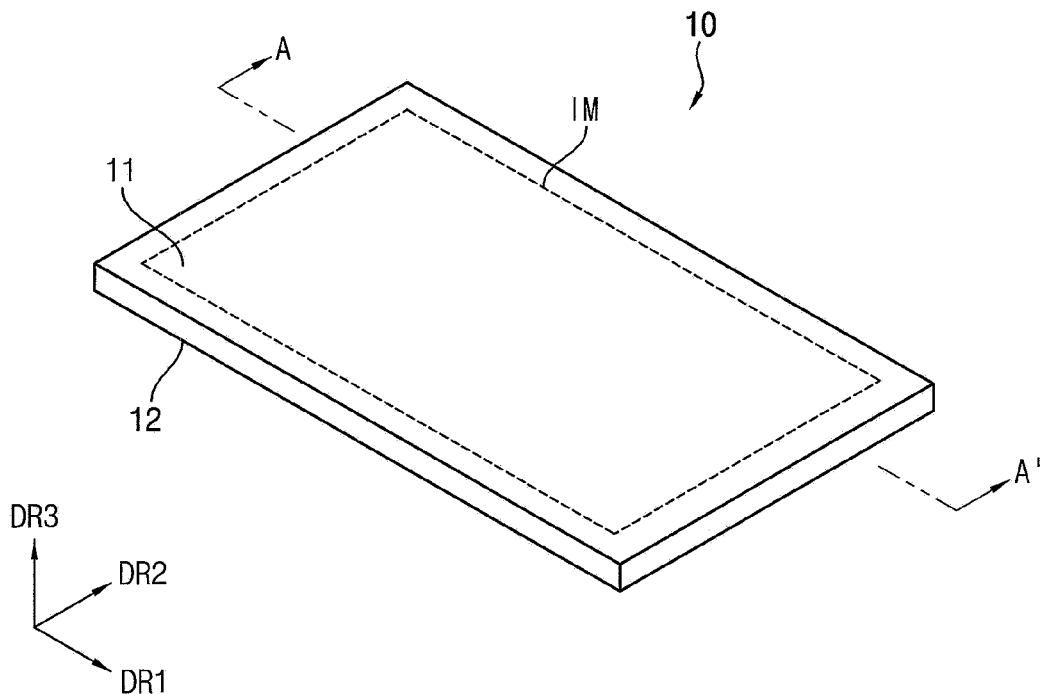
FIG. 1 is a perspective view of an exemplary embodiment illustrating an unfolded position of a foldable display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A foldable display device 10 according to an exemplary embodiment will be described with reference to FIGS. 1 to 3. FIG. 1 is a perspective view of an exemplary embodiment illustrating an unfolded position of a foldable display device constructed according to principles of the invention.

Referring to FIG. 1, a foldable display device 10 may include a display surface 11 and a back surface 12 opposite to the display surface 11. The display surface 11 and the back surface 12 may be substantially parallel to a first direction DR1 and a second direction DR2 intersecting the first direction DR1. The display surface 11 may be positioned in a third direction DR3 intersecting the first direction DR1 and the second direction DR2 from the back surface 12. In other words, the display surface 11 may be positioned in the thickness direction of the foldable display device 10 from the back surface 12.

The foldable display device 10 may provide an image IM to a user through the display surface 11. In other words, the display surface 11 may be a surface on which the image IM is displayed. In an exemplary embodiment, the back surface 12 may be a non-display surface on which an image is not displayed. However, the exemplary embodiments are not limited thereto, and in another exemplary embodiment, the back surface 12 may be a display surface on which an image is displayed. In such another exemplary embodiment, the foldable display device 10 may display an image toward opposite surfaces.

Figure 2:
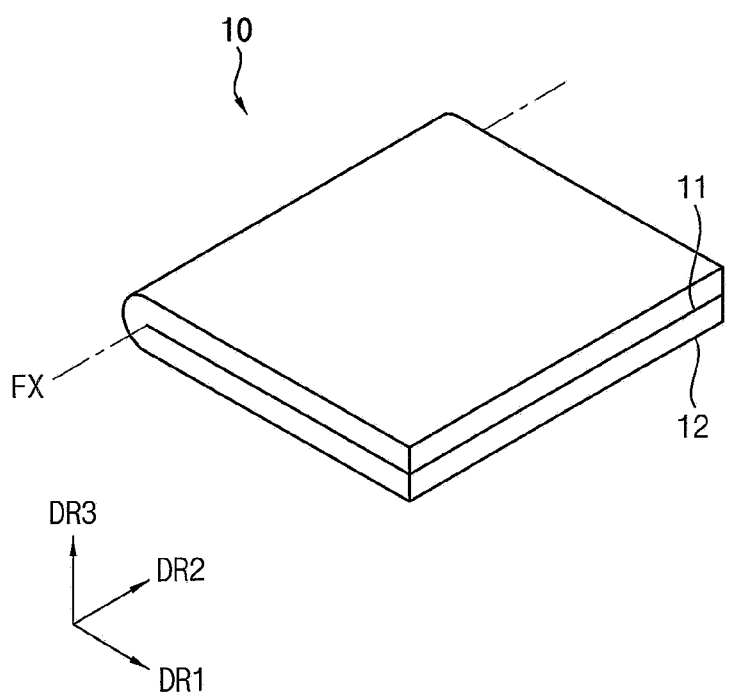
FIG. 2 is a perspective view illustrating a folded position of the foldable display device of FIG. 1.

FIG. 2 is a perspective view illustrating a folded position of the foldable display device of FIG. 1.

Referring to FIG. 2, in an exemplary embodiment, the foldable display device 10 may be in-folded with respect to a folding axis FX. In such an exemplary embodiment, the foldable display device 10 may be folded such that portions of the display surface 11 face each other. Since the display surface 11 of the foldable display device 10 is not exposed to outside in an in-folded position, the display surface 11 may be protected from impact, contact, etc. from the outside. However, the exemplary embodiments are not limited thereto, and in another exemplary embodiment, the foldable display device 10 may be out-folded with respect to the folding axis FX. In such another exemplary embodiment, the foldable display device 10 may be folded such that portions of the back surface 12 face each other.

Figure 3:
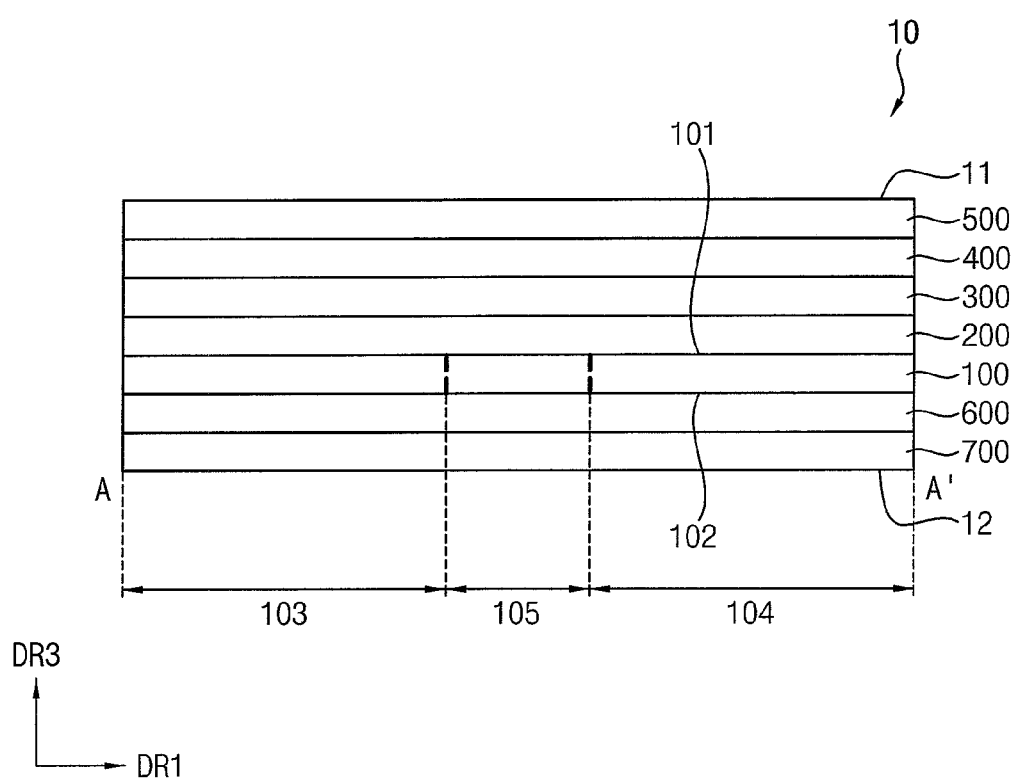
FIG. 3 is a cross-sectional view taken along a line A-A' of FIG. 1.

FIG. 3 is a cross-sectional view taken along a line A-A' of FIG. 1.

Referring to FIG. 3, the foldable display device 10 may include a display panel 100, a polarization layer 200, an impact absorbing layer 300, a window 400, a protective layer 500, a protective film 600, and a cushion layer 700. As described above, because the foldable display device 10 may be folded or unfolded, each of the display panel 100, the polarization layer 200, the impact absorbing layer 300, the window 400, the protective layer 500, the protective film 600, and the cushion layer 700 may have flexible characteristics.

The display panel 100 may include a plurality of pixels, and may generate an image formed by combining light beams emitted from the pixels. The display panel 100 may include a first surface 101 and a second surface 102 that are opposite to each other. For example, the first surface 101 and the second surface 102 may be an upper surface and a lower surface of the display panel 100, respectively. The display panel 100 may display the image toward the first surface 101.

The polarization layer 200 may be disposed on the display panel 100. The polarization layer 200 may be disposed on the first surface 101 of the display panel 100. The polarization layer 200 may reduce a reflection of external light of the foldable display device 10. For example, when the external light passes through the polarization layer 200, is reflected from a lower portion of the polarization layer 200 (for example, the display panel 100), and passes through the polarization layer 200 again, the external light passes through the polarization layer 200 twice, and thus the phase of the external light may be changed. Accordingly, the phase of the reflected light is different from the phase of the incident light entering the polarization layer 200, so that destructive interference may occur, and the reflection of the external light decreases, so that the visibility of the foldable display device 10 may be improved.

The impact absorbing layer 300 may be disposed on the polarization layer 200. The impact absorbing layer 300 may absorb external impact. For example, when the external impact is applied through the display surface 11 of the foldable display device 10, the impact absorbing layer 300 may absorb the impact to prevent the impact from being transferred to the display panel 100.

The window 400 may be disposed on the impact absorbing layer 300. The window 400 may protect the display panel 100 and the polarization layer 200 from external impact, and may transmit the image displayed from the display panel 100. In an exemplary embodiment, the windows 400 may include a polymer resin such as a polycarbonate (PC), a polymethyl methacrylate (PMMA), a polyarylate (PAR), a polyethersulfone (PES), a polyethylene terephthalate (PET), or a polyethylene naphthalate (PEN), a glass and the like.

The protective layer 500 may be disposed on the window 400. The protective layer 500 may improve an impact resistance of the window 400, and may prevent particles of the window 400 from being scattered when the window 400 is broken by external impact.

The protective film 600 may be disposed under the display panel 100. For example, the protective film 600 may be disposed on the second surface 102 of the display panel 100. The protective film 600 may protect the second surface 102 of the display panel 100. In an exemplary embodiment, the protective film 600 may include a polymer resin.

The cushion layer 700 may be disposed under the protective film 600. The cushion layer 700 may absorb external impact. For example, when the external impact is applied through the back surface 12 of the foldable display device 10, the cushion layer 700 may absorb the impact to prevent the impact from being transferred to the display panel 100.

The display panel 100 may include a first non-bendable portion 103, a second non-bendable portion 104, and a bendable portion 105. The second non-bendable portion 104 may be positioned in the first direction DR1 from the first non-bendable portion 103, and the bendable portion 105 may be positioned between the first non-bendable portion 103 and the second non-bendable portion 104. The first non-bendable portion 103 and the second non-bendable portion 104 may be portions that are not bent in the display panel 100. The bendable portion 105 may be a portion that is bent in the display panel 100. When the bendable portion 105 of the display panel 100 is bent, the polarization layer 200, the impact absorbing layer 300, the window 400, the protective layer 500, the protective film 600, and the cushion layer 700 disposed on the first surface 101 or the second surface 102 of the display panel 100 may also be bent according to the degree of bending of the display panel 100.

An adhesive layer may be interposed between the display panel 100 and the polarization layer 200, between the polarization layer 200 and the impact absorbing layer 300, between the impact absorbing layer 300 and the window 400, between the window 400 and the protective layer 500, between the display panel 100 and the protective film 600, and/or between the protective film 600 and the cushion layer 700. In an exemplary embodiment, the adhesive layer may be a pressure sensitive adhesive (PSA) or an optically clear adhesive (OCA).

The foldable display device 10 may further include an input sensing layer disposed between the display panel 100 and the polarization layer 200. The input sensing layer may sense an external input such as an external object that comes into contact with or approaches the foldable display device 10. For example, the input sensing layer may sense the external input by using a capacitive scheme.

Figure 4:
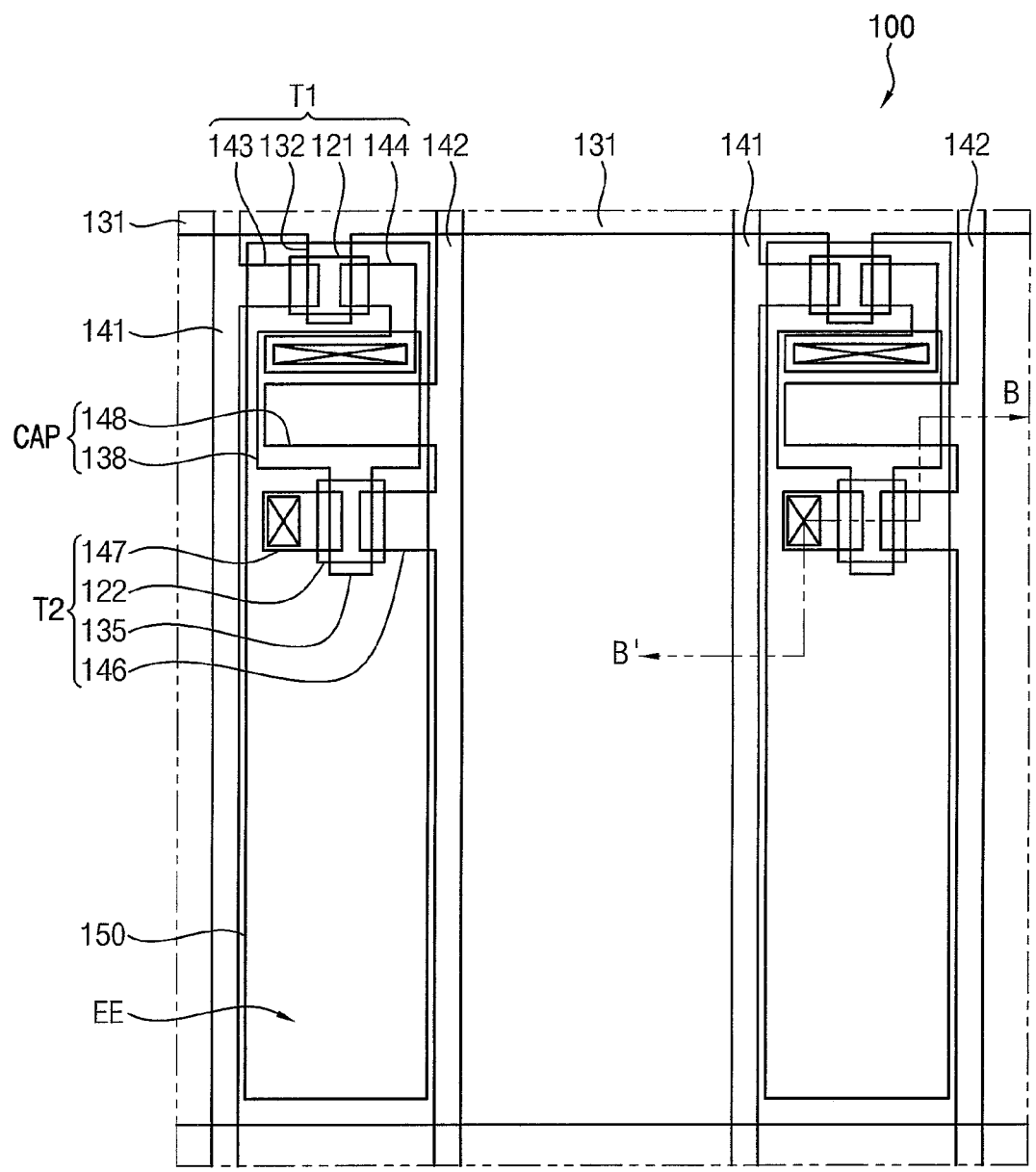
FIG. 4 is a plan view illustrating an exemplary embodiment of a display panel constructed according to principles of the invention.
Figure 5:
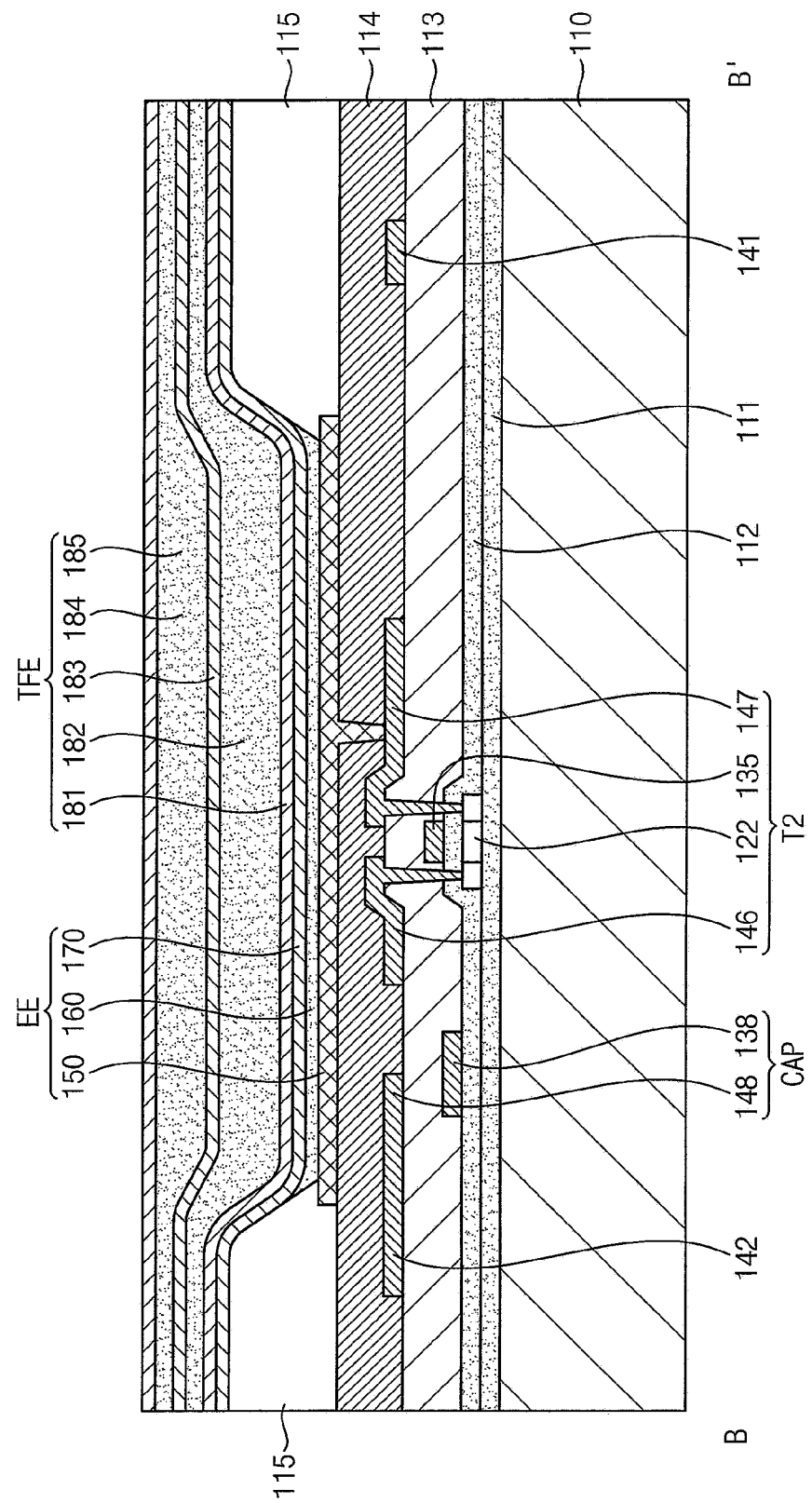
FIG. 5 is a cross-sectional view taken along a line B-B' of FIG. 4.

Hereinafter, the display panel 100 according to an exemplary embodiment will be described with reference to FIGS. 4 and 5. FIG. 4 is a plan view illustrating an exemplary embodiment of a display panel constructed according to principles of the invention. For example, FIG. 4 may illustrate the display panel 100 in FIG. 3. FIG. 5 is a cross-sectional view taken along a line B-B' of FIG. 4.

Referring to FIGS. 4 and 5, the display panel 100 may include a plurality of pixels in which each of the pixels includes a switching thin film transistor T1, a driving thin film transistor T2, a capacitor CAP, and a light emitting element EE. The pixel denotes a minimum unit for displaying an image, and the display panel 100 may display the image through the pixels. Although FIGS. 4 and 5 illustrate that two thin film transistors and one capacitor are disposed in one representative pixel, the exemplary embodiments are not limited thereto, and each pixel may be provided with at least three thin film transistors and/or at least two capacitors. The display panel 100 may include a substrate 110, a gate line 131 disposed on the substrate 110, a data line 141 insulated from and intersected with the gate line 131, and a common power line 142. In general, one pixel may be defined by the boundary between the gate line 131, the data line 141, and the common power line 142, but the pixel is not limited to the above-described definition. The pixel may be defined by a black matrix or a pixel defining layer.

The substrate 110 may include a flexible material such as a plastic. For example, the substrate 110 may be formed of a polyethersulfone (PES), a polycarbonate (PC), a polyimide (PI), a polyethylene terephthalate (PET), a polyethylene naphthalate (PEN), a polyacrylate (PAR), a fiber reinforced plastic (FRP), or the like.

The substrate 110 may have a thickness of about 5 μm to about 200 μm. When the substrate 110 has a thickness less than about 5 μm, it may be difficult for the substrate 110 to stably support the light emitting element EE. In addition, when the substrate 110 has a thickness greater than about 200 μm, the flexible characteristics of the substrate 110 may be deteriorated.

The buffer layer 111 may be disposed on the substrate 110. The buffer layer 111 may serve to prevent the penetration of impurities and planarize a surface. The buffer layer 111 may be formed of a silicon nitride, a silicon oxide, a silicon oxynitride, or the like. However, the buffer layer 111 is not necessarily required, and may be omitted according to a type of the substrate 110 and processing conditions.

A switching semiconductor layer 121 and a driving semiconductor layer 122 may be disposed on the buffer layer 111. The switching semiconductor layer 121 and the driving semiconductor layer 122 may be formed of one of a polycrystalline silicon, an amorphous silicon, and oxide semiconductors such as an indium gallium zinc oxide (IGZO), an indium zinc tin oxide (IZTO) or the like. For example, when the driving semiconductor layer 122 is formed of a polycrystalline silicon, the driving semiconductor layer 122 may include a channel region that is not doped with impurities, and a source region and a drain region that are formed by doping impurities on opposite sides of the channel region. In this case, the doped impurities are P-type impurities such as boron (B), and $B_2H_6$ may be mainly used.

The impurities may vary depending on the type of thin film transistor. Although the thin film transistor having a P-channel metal oxide semiconductor (PMOS) structure using the P-type impurities is used as the driving thin film transistor T2 in this exemplary embodiment, the driving thin film transistor T2 is not limited thereto, and a thin film transistor having an N-channel metal oxide semiconductor (NMOS) structure or a complementary metal oxide semiconductor (CMOS) structure may be used as the driving thin film transistor T2.

A gate insulating layer 112 may be disposed on the switching semiconductor layer 121 and the driving semiconductor layer 122. The gate insulating layer 112 may be formed of a tetraethoxysilane (TEOS), a silicon nitride, a silicon oxide, or the like. In an exemplary embodiment, the gate insulating layer 112 may have a double-layer structure in which a silicon nitride layer having a thickness of about 40 nm and a tetraethoxysilane layer having a thickness of about 80 nm are sequentially stacked.

A gate wiring including gate electrodes 132 and 135 may be disposed on the gate insulating layer 112. The gate wiring may further include the gate line 131, a first power storage plate 138, and the like. The gate electrodes 132 and 135 may be disposed to overlap at least a portion (e.g., the channel region) of the semiconductor layers 121 and 122. When the impurities are doped in the source region and the drain region of the semiconductor layers 121 and 122 in the process of forming the semiconductor layers 121 and 122, the gate electrodes 132 and 135 may serve to block the impurities from being doped in the channel region.

The gate electrodes 132 and 135 and the first power storage plate 138 may be disposed on the same layer, and may be formed of substantially the same metal. For example, the gate electrodes 132 and 135 and the first power storage plate 138 may be formed of molybdenum (Mo), chromium (Cr), tungsten (W), or the like.

An interlayer insulating layer 113 covering the gate electrodes 132 and 135 may be disposed on the gate insulating layer 112. Like the gate insulating layer 112, the interlayer insulating layer 113 may be formed of a tetraethoxysilane, a silicon nitride, a silicon oxide, or the like, but the material of the interlayer insulating layer 113 is not limited thereto.

Data wirings including source electrodes 143 and 146 and drain electrodes 144 and 147 may be disposed on the interlayer insulating layer 113. The data wiring may further include the data line 141, the common power line 142, a second power storage plate 148, and the like. The source electrodes 143 and 146 and the drain electrodes 144 and 147 may be connected to the source region and the drain region of the semiconductor layers 121 and 122 through contact holes formed in the gate insulating layer 112 and the interlayer insulating layer 113, respectively.

The switching thin film transistor T1 may include the switching semiconductor layer 121, a switching gate electrode 132, a switching source electrode 143, and a switching drain electrode 144, and the driving thin film transistor T2 may include the driving semiconductor layer 122, a driving gate electrode 135, a driving source electrode 146, and a driving drain electrode 147. In addition, the capacitor CAP may include the first power storage plate 138 and the second power storage plate 148 that are disposed with the interlayer insulating layer 113 therebetween.

The switching thin film transistor T1 may be used as a switching element for selecting a pixel configured to emit light. The switching gate electrode 132 may be connected to the gate line 131. The switching source electrode 143 may be connected to the data line 141. The switching drain electrode 144 may be spaced apart from the switching source electrode 143 and connected to the first power storage plate 138.

The driving thin film transistor T2 may apply a driving power, which allows the light emitting layer 160 of the light emitting element EE in the selected pixel, to the pixel electrode 150. The driving gate electrode 135 may be connected to the first power storage plate 138. The driving source electrode 146 and the second power storage plate 148 may be connected to the common power line 142. The driving drain electrode 147 may be connected to the pixel electrode 150 of the light emitting element EE through a contact hole.

According to the above exemplary structure, the switching thin film transistor T1 may be operated by a gate voltage applied to the gate line 131, thereby serving to transfer the data voltage applied to the data line 141 to the driving thin film transistor T2. A voltage corresponding to the difference between the common voltage applied from the common power line 142 to the driving thin film transistor T2 and the data voltage transferred from the switching thin film transistor T1 may be stored in the capacitor CAP, and a current corresponding to the voltage stored in the capacitor CAP flows into the light emitting element EE through the driving thin film transistor T2, so that the light emitting element EE may emit light.

A planarization layer 114 may be disposed on the interlayer insulating layer 113 to cover the data wirings patterned on the same layer as the data line 141, the common power line 142, the source electrodes 143 and 146, the drain electrodes 144 and 147, and the second power storage plate 148.

The planarization layer 114 may serve to remove and planarize steps to increase the luminance efficiency of the light emitting element EE formed thereon. The planarization layer 114 may be formed of an acrylic-based resin (polyacrylates resin), an epoxy resin, phenolic resins, a polyamide-based resin, a polyimide-based resin, an unsaturated polyester-based resin, a polyphenylene-based resin, a polyphenylene sulfide-based resin, a benzocyclobutene (BCB), or the like.

The pixel electrode 150 of the light emitting element EE may be disposed on the planarization layer 114. The pixel electrode 150 may be connected to the drain electrode 147 through a contact hole formed in the planarization layer 114.

A pixel defining layer 115 may be disposed on the planarization layer 114 to expose at least a portion of the pixel electrode 150 so as to define a pixel region. The pixel electrode 150 may be disposed to correspond to the pixel region of the pixel defining layer 115. The pixel defining layer 115 may be formed of a polyacrylate-based resin, a polyimide-based resin, or the like.

The light emitting layer 160 may be disposed on the pixel electrode 150 in the pixel region, and the common electrode 170 may be disposed on the pixel defining layer 115 and the light emitting layer 160. The light emitting layer 160 may be formed of a low molecular organic material or a high molecular organic material. At least one of a hole injection layer (HIL) and a hole transport layer (HTL) may be further disposed between the pixel electrode 150 and the light emitting layer 160, and at least one of an electron transport layer (ETL) and an electron injection layer (EIL) may be further disposed between the light emitting layer 160 and the common electrode 170.

Each of the pixel electrode 150 and the common electrode 170 may be formed as any one of a transmissive electrode, a transflective electrode, and a reflective electrode. Transparent conductive oxide (TCO) may be used to form the transmissive electrode. The transparent conductive oxide (TCO) may include an indium tin oxide (ITO), an indium zinc oxide (IZO), a zinc oxide (ZnO), an indium oxide ($In_2O_3$), and the like.

In order to form the transflective electrode and the reflective electrode, metal such as magnesium (Mg), silver (Ag), gold (Au), calcium (Ca), lithium (Li), chromium (Cr), aluminum (Al), copper (Cu), or an alloy thereof may be used. The thickness of the electrode may determine whether the electrode is the transflective electrode or the reflective electrode. In general, the transflective electrode may have a thickness of about 200 nm or less, and the reflective electrode may have a thickness of about 300 nm or more. The transflective electrode may have a higher light transmittance but have a higher resistance as the thickness decreases, and may have a lower light transmittance as the thickness increases. In addition, the transflective electrode and the reflective electrode may be formed in a multilayer structure including a metal layer formed of metal or a metal alloy and a transparent conductive oxide layer stacked on the metal layer.

A thin film encapsulation layer TFE may be disposed on the common electrode 170. The thin film encapsulation layer TFE may include at least one inorganic layer 181, 183, and 185, and at least one organic layer 182 and 184. The thin film encapsulation layer TFE may have a structure in which the inorganic layers 181, 183 and 185 and the organic layers 182 and 184 are alternately stacked. In this case, the inorganic layer 181 may be disposed at the bottom. In other words, the inorganic layer 181 may be disposed most adjacent to the light emitting element EE.

Although FIG. 5 illustrates that the thin film encapsulation layer TFE includes three inorganic layers 181, 183 and 185 and two organic layers 182 and 184, the exemplary embodiments are not limited thereto. The inorganic layers 181, 183 and 185 may be formed of at least one inorganic material of $Al_2O_3$, $TiO_2$, $ZrO$, $SiO_2$, AlON, AlN, SiON, $Si_3N_4$, ZnO, and $Ta_2O_5$. The inorganic layers 181, 183 and 185 may be formed through a chemical vapor deposition (CVD) or an atomic layer deposition (ALD). The inorganic layers 181, 183 and 185 may mainly block the penetration of moisture or oxygen. The inorganic layers 181, 183 and 185 may block most of the moisture and oxygen from penetrating into the light emitting element EE.

The organic layers 182 and 184 may be formed of a polymer-based material. The polymer-based material may include an acrylate-based resin, an epoxy-based resin, a polyimide, a polyethylene, and the like. In addition, the organic layers 182 and 184 may be formed through a thermal deposition process. The thermal deposition process for forming the organic layers 182 and 184 may be performed within a temperature range that does not damage the light emitting element EE.

The thin film encapsulation layer TFE may have a thickness of about 10 µm or less. Accordingly, the overall thickness of the display panel 100 may be formed to be very thin. As such, the thin film encapsulation layer TFE may be disposed on the light emitting element EE, so that the flexible characteristics of the display panel 100 may be maximized.

Figure 6:
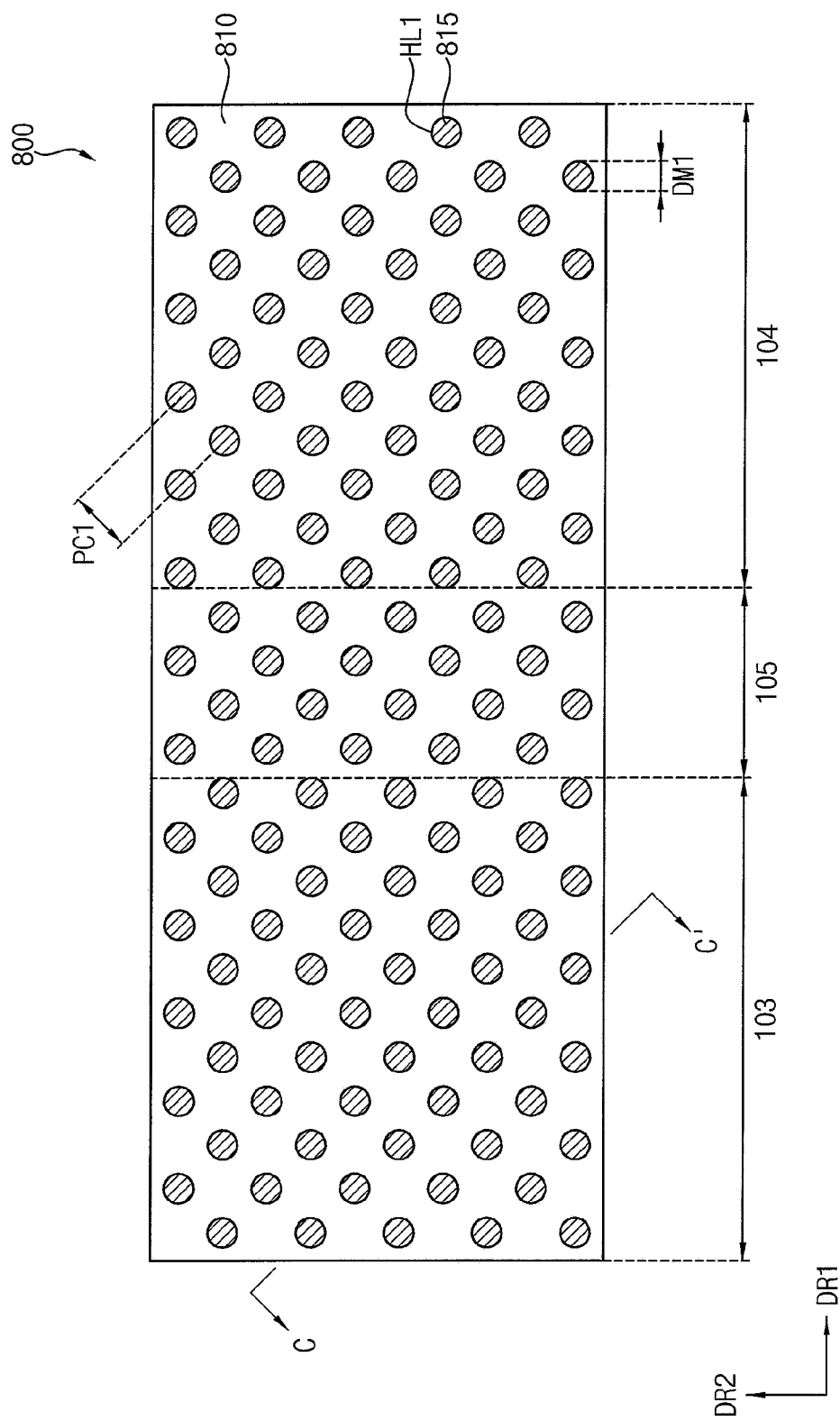
FIG. 6 is a plan view illustrating an exemplary embodiment of a functional member constructed according to principles of the invention.
Figure 7:
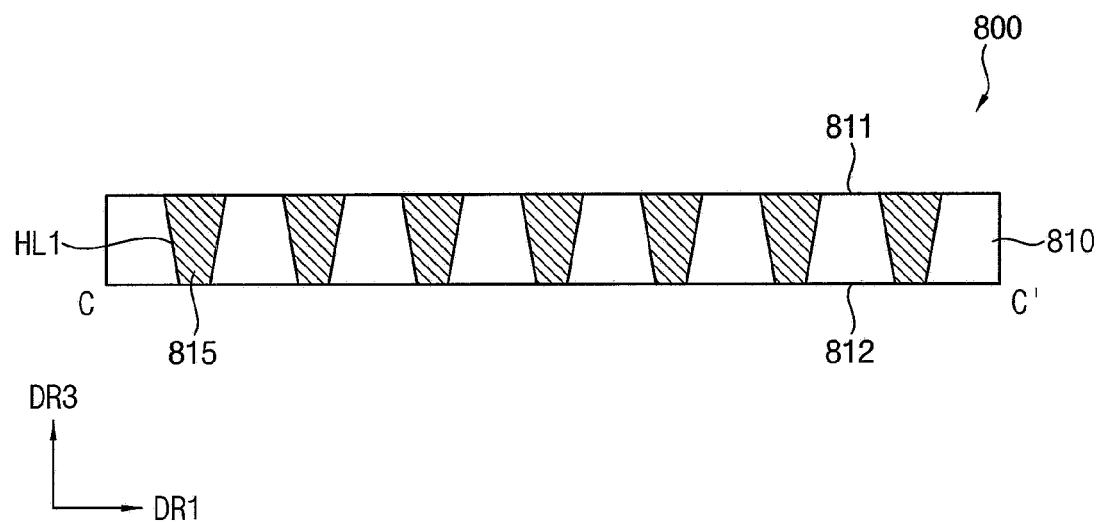
FIG. 7 is a cross-sectional view taken along a line C-C' of FIG. 6.

Hereinafter, exemplary embodiments of functional members that may be implemented in a foldable display device will be described with reference to FIGS. 6 to 12. FIG. 6 is a plan view illustrating an exemplary embodiment of a functional member constructed according to principles of the invention. FIG. 7 is a cross-sectional view taken along a line C-C' of FIG. 6.

Referring to FIGS. 3, 6, and 7, a functional member in the form of a functional layer 800 may be disposed between the display panel 100 and the window 400 or on the window 400. In exemplary embodiments, the functional layer 800 may be the impact absorbing layer 300 disposed between the display panel 100 and the window 400 and/or the protective layer 500 disposed on the window 400.

In an exemplary embodiment, the functional layer 800 may include a first functional layer 810 and a first material in the form of a first filler 815. A plurality of first discontinuities in the form of first holes HL1 may be formed in the first functional layer 810, and the first filler 815 may fill at least some of the first holes HL1. Accordingly, the functional layer 800 may include the first functional layer 810 and a plurality of first fillers 815 respectively filling the first holes HL1.

The elastic modulus of the first filler 815 may be greater than the elastic modulus of the first functional layer 810. In other words, the first functional layer 810 may have a relatively low elastic modulus, and the first filler 815 may have a relatively high elastic modulus. In an exemplary embodiment, the elastic modulus of the first functional layer 810 may be less than about 1 GPa, and the elastic modulus of the first filler 815 may be greater than or equal to about 1 GPa. The impact resistance of the functional layer 800 may be improved when the functional layer 800 includes only the first functional layer 810 because the elastic modulus of the first functional layer 810 is relatively low, however, buckling or delamination of the functional layer 800 may occur when a stress (e.g., a compressive stress) is applied to the functional layer 800 according to folding of the foldable display device. However, in the exemplary embodiments, because the functional layer 800 includes the first filler 815 filling each of the first holes HL1 of the first functional layer 810 and having a relatively high elastic modulus, the buckling or the delamination of the functional layer 800 may be prevented although the stress is applied to the functional layer 800 according to the folding of the foldable display device.

In an exemplary embodiment, each of the first functional layer 810 and the first filler 815 may include a light transmitting material. For example, the first functional layer 810 may include at least one of a polyamide (PA) and a polyurethane (PU), and the first filler 815 may include a poly(methyl methacrylate) (PMMA). Because the functional layer 800 is disposed between the display panel 100 and the window 400 or on the window 400, an image displayed from the display panel 100 toward the window 400 may pass through the functional layer 800. Accordingly, each of the first functional layer 810 and the first filler 815 of the functional layer 800 may include the light transmitting material.

In an exemplary embodiment, each of the first holes HL1 may have a generally circular shape in a plan view. In other words, the first filler 815 filling each of the first holes HL1 may have a generally circular shape in a plan view.

In an exemplary embodiment, the diameter DM1 of each of the first holes HL1 may be from about 4 µm to about 100 µm. In other words, the diameter DM1 of the first filler 815 filling each of the first holes HL1 may be from about 4 µm to about 100 µm. When the diameter of each of the first holes HL1 is less than about 4 µm, a material for forming the first filler 815 may not be injected into the first hole HL1 in the process of forming the first filler 815 because the area of the first hole HL1 is too small. Further, when the diameter of each of the first holes HL1 is greater than about 100 μm, the first filler 815 may be recognized or external impact may be transferred to the display panel 100 through the first filler 815 having a relatively high elastic modulus because the area of the first filler 815 filling the first hole HL1 is too large.

In an exemplary embodiment, each of the first holes HL1 may have a generally trapezoidal shape in a cross-sectional view. In other words, the first filler 815 filling each of the first holes HL1 may have a generally trapezoidal shape in a cross-sectional view. For example, the first holes HL1 may be formed by a laser cutting to irradiate with a laser beam, therefore, the first hole HL1 having the generally trapezoidal shape in which the width of a portion where the laser beam is irradiated first is greater than the width of a portion where the laser beam is irradiated later may be formed.

In an exemplary embodiment, each of the first holes HL1 may be a through hole passing through the first functional layer 810. The first functional layer 810 may have a first surface 811 and a second surface 812 opposite to each other in the third direction DR3, and the first hole HL1 may pass through the first functional layer 810 in the third direction DR3. Accordingly, the first filler 815 may have a thickness in the third direction DR3 corresponding to the vertical distance between the first surface 811 and the second surface 812.

In an exemplary embodiment, the first holes HL1 may overlap the first non-bendable portion 103, the second non-bendable portion 104, and the bendable portion 105 of the display panel 100. In other words, the first fillers 815 respectively filling the first holes HL1 may overlap the first non-bendable portion 103, the second non-bendable portion 104, and the bendable portion 105 of the display panel 100. Buckling or delamination of the functional layer 800 due to bending of the bendable portion 105 of the display panel 100 may be prevented although the first fillers 815 only overlap the bendable portion 105. However, the first fillers 815 may be recognized by a user because the first fillers 815 are partially positioned in the first functional layer 810 in a plan view. Accordingly, the first fillers 815 may overlap the first non-bendable portion 103 and the second non-bendable portion 104 as well as the bendable portion 105, so that the first fillers 815 may be entirely positioned in the first functional layer 810 in a plan view. Therefore, the first fillers 815 may not be recognized by the user.

In an exemplary embodiment, a pitch PC1 between the first holes HL1 may be greater than or equal to about 200 μm. The pitch PC1 between the first holes HL1 may be a gap between adjacent first holes HL1. For example, the pitch PC1 between the first holes HL1 may be the distance from a center of a first hole HL1 to a center of another adjacent first hole HL1. When the pitch PC1 between the first holes HL1 is less than about 200 μm, the number of first fillers 815 per unit area may be excessively large, so that external impact may be transferred to the display panel 100 through the first fillers 815 having a relatively high elastic modulus.

Figure 8:
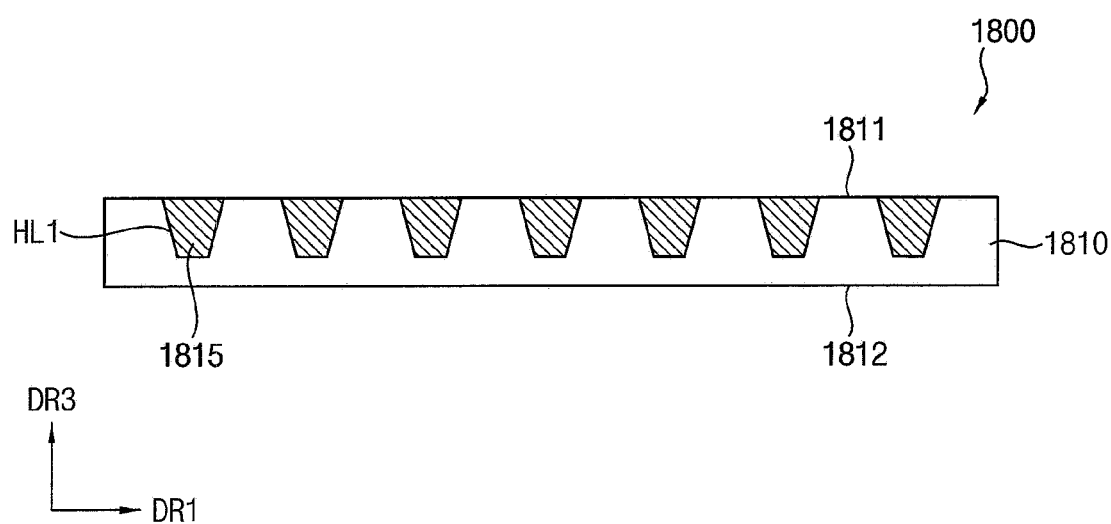
FIG. 8 is a cross-sectional view illustrating an exemplary embodiment of a functional member constructed according to principles of the invention.

FIG. 8 is a cross-sectional view illustrating an exemplary embodiment of a functional member constructed according to principles of the invention. Descriptions of elements of the functional layer 1800 described with reference to FIG. 8, which are substantially the same as or similar to those of the functional layer 800 described with reference to FIG. 7, will not be repeated to avoid redundancy.

Referring to FIG. 8, in an exemplary embodiment, each of the first holes HL1 may be a recessed hole recessed from a surface of the first functional layer 1810. The first functional layer 1810 may have a first surface 1811 and a second surface 1812 opposite to each other in the third direction DR3, and the first hole HL1 may be recessed from the first surface 1811 toward the second surface 1812. In this case, the thickness of the first filler 1815 in the third direction DR3 may be less than the thickness of the first functional layer 1810 in the third direction DR3 corresponding to the vertical distance between the first surface 1811 and the second surface 1812.

Figure 9:
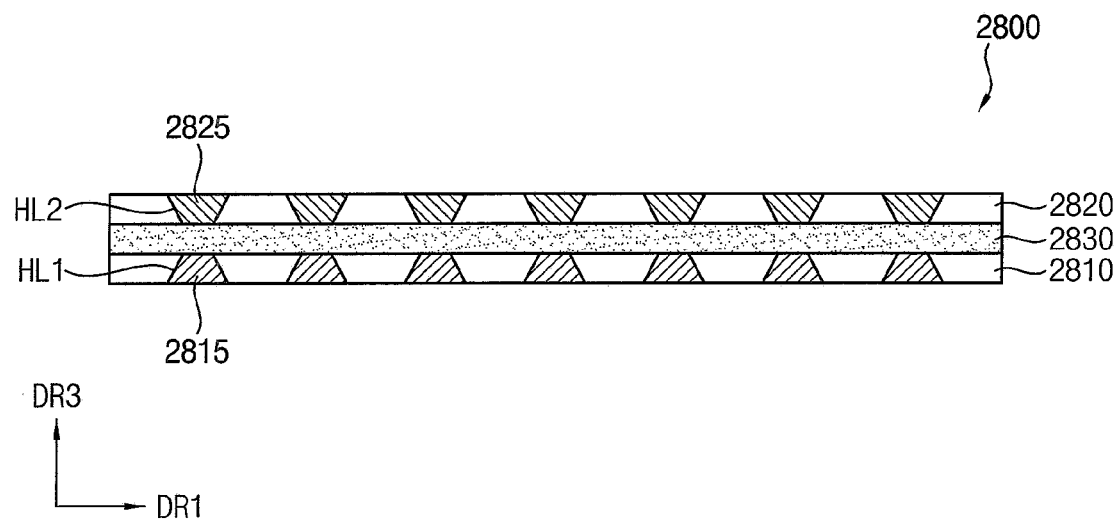
FIG. 9 is a cross-sectional view illustrating another exemplary embodiment of a functional member constructed according to principles of the invention.

FIG. 9 is a cross-sectional view illustrating another exemplary embodiment of a functional member constructed according to principles of the invention. Descriptions of elements of the functional layer 2800 described with reference to FIG. 9, which are substantially the same as or similar to those of the functional layer 800 described with reference to FIG. 7, will not be repeated to avoid redundancy.

Referring to FIG. 9, in an exemplary embodiment, the functional layer 2800 may include a first functional layer 2810, a first filler 2815, a second functional layer 2820, a second material in the form of a second filler 2825, and a third functional layer 2830. The second functional layer 2820 may be disposed on the first functional layer 2810, and the third functional layer 2830 may be disposed between the first functional layer 2810 and the second functional layer 2820. A plurality of second discontinuities in the form of second holes HL2 may be formed in the second functional layer 2820, and the second filler 2825 may fill each of the second holes HL2. Accordingly, the functional layer 2800 may include the first functional layer 2810, a plurality of first fillers 2815 respectively filling the first holes HL1, the second functional layer 2820, a plurality of second fillers 2825 respectively filling the second holes HL2, and the third functional layer 2830.

The elastic modulus of the second filler 2825 may be greater than the elastic modulus of the second functional layer 2820. In an exemplary embodiment, the elastic modulus of the second functional layer 2820 may be less than about 1 GPa, and the elastic modulus of the second filler 2825 may be greater than or equal to about 1 GPa. For example, the elastic modulus of the second functional layer 2820 may be substantially equal to the elastic modulus of the first functional layer 2810, and the elastic modulus of the second filler 2825 may be substantially equal to the elastic modulus of the first filler 2815.

In an exemplary embodiment, the elastic modulus of the third functional layer 2830 may be greater than the elastic modulus of the first functional layer 2810 and the elastic modulus of the second functional layer 2820. For example, the elastic modulus of the third functional layer 2830 may be greater than the elastic modulus of the first functional layer 2810 and the elastic modulus of the second functional layer 2820, and may be less than the elastic modulus of the first filler 2815 and the elastic modulus of the second filler 2825.

In an exemplary embodiment, each of the second functional layer 2820, the second filler 2825, and the third functional layer 2830 may include a light transmitting material. For example, the second functional layer 2820 may include at least one of a polyamide (PA) and a polyurethane (PU), the second filler 2825 may include a poly(methyl methacrylate) (PMMA), and the third functional layer 2830 may include a polyimide (PI).

In an exemplary embodiment, each of the second holes HL2 may have a generally circular shape in a plan view. In other words, the second filler 2825 filling each of the second holes HL2 may have a generally circular shape in a plan view.

In an exemplary embodiment, the diameter of each of the second holes HL2 may be from about 4 μm to about 100 μm.

In other words, the diameter of the second filler 2825 filling each of the second holes HL2 may be from about 4 μm to about 100 μm. For example, the diameter of each of the second holes HL2 may be substantially equal to the diameter of each of the first holes HL1.

In an exemplary embodiment, each of the second holes HL2 may have a generally trapezoidal shape in a cross-sectional view. In other words, the second filler 2825 filling each of the second holes HL2 may have a generally trapezoidal shape in a cross-sectional view.

In an exemplary embodiment, each of the second holes HL2 may be a through hole passing through the second functional layer 2820. The second hole HL2 may pass through the second functional layer 2820 in the third direction DR3. Accordingly, the second filler 2825 may have a thickness in the third direction DR3 corresponding to the vertical distance between opposite surfaces of the second functional layer 2820.

In an exemplary embodiment, the second holes HL2 may respectively overlap the first holes HL1. In other words, the second fillers 2825 filling the second holes HL2 may respectively overlap the first fillers 2815 filling the first holes HL1. However, the exemplary embodiments are not limited thereto, and in another exemplary embodiment, the second holes HL2 may not overlap the first holes HL1.

Figure 10:
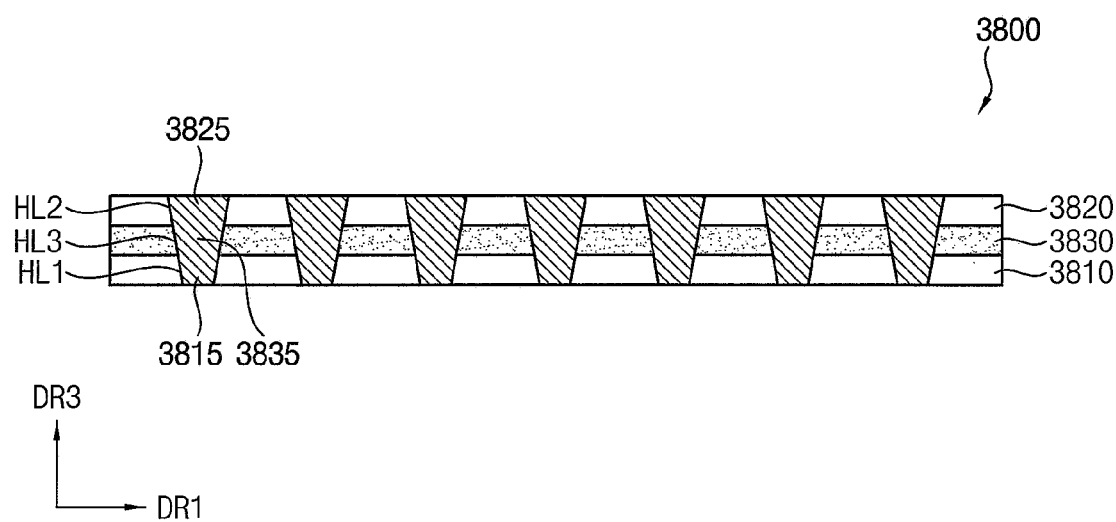
FIG. 10 is a cross-sectional view illustrating a further exemplary embodiment of a functional member constructed according to principles of the invention.

FIG. 10 is a cross-sectional view illustrating a further exemplary embodiment of a functional member constructed according to principles of the invention. Descriptions of elements of the functional layer 3800 described with reference to FIG. 10, which are substantially the same as or similar to those of the functional layer 2800 described with reference to FIG. 9, will not be repeated to avoid redundancy.

Referring to FIG. 10, in an exemplary embodiment, the functional layer 3800 may include a first functional layer 3810, a first filler 3815, a second functional layer 3820, a second filler 3825, a third functional layer 3830, and a third material in the form of a third filler 3835. A plurality of third discontinuities in the form of third holes HL3 may be formed in the third functional layer 3830, and the third filler 3835 may fill each of the third holes HL3. Accordingly, the functional layer 3800 may include the first functional layer 3810, a plurality of first fillers 3815 respectively filling the first holes HL1, the second functional layer 3820, a plurality of second fillers 3825 respectively filling the second holes HL2, the third functional layer 3830, and a plurality of third fillers 3835 respectively filling the third holes HL3.

The elastic modulus of the third filler 3835 may be greater than the elastic modulus of the third functional layer 3830. In an exemplary embodiment, the elastic modulus of the third functional layer 3830 may be less than about 1 GPa, and the elastic modulus of the third filler 3835 may be greater than or equal to about 1 GPa. For example, the elastic modulus of the third filler 3835 may be substantially equal to the elastic modulus of the first filler 3815 and the elastic modulus of the second filler 3825.

In an exemplary embodiment, the first hole HL1, the second hole HL2, and the third hole HL3 may be integrally formed. In such an exemplary embodiment, the first filler 3815, the second filler 3825, and the third filler 3835 may be integrally formed. For example, after sequentially forming the first functional layer 3810, the second functional layer 3820, and the third functional layer 3830, a through hole passing through the first to third functional layers 3810, 3820, and 3830 may be formed by a laser cutting to irradiate with a laser beam. Accordingly, the first to third holes HL1, HL2, and HL3 may be integrally formed. Then, a filler forming material may be injected into the integrally formed first to third holes HL1, HL2, and HL3 to integrally form the first to third fillers 3815, 3825, and 3835.

Figure 11:
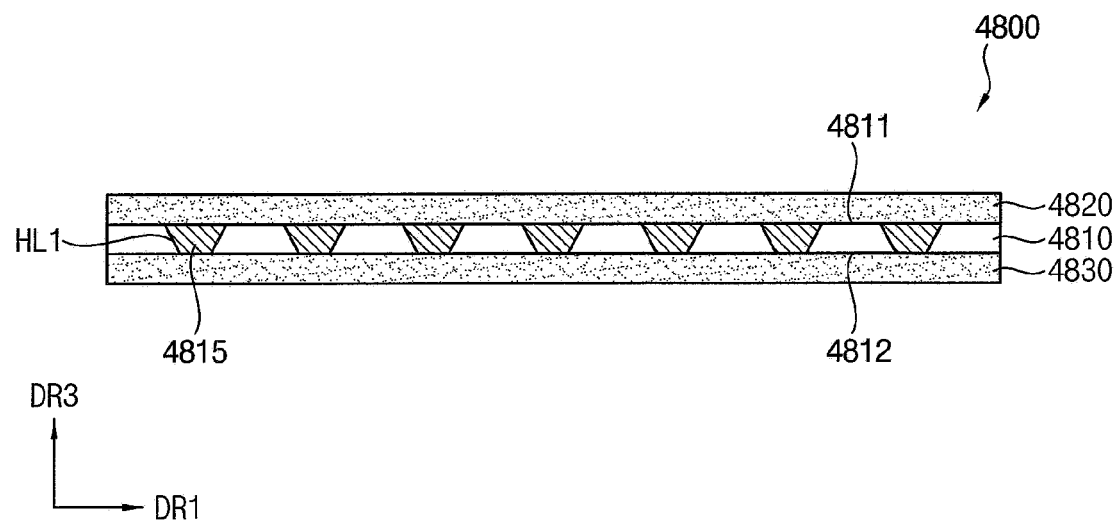
FIG. 11 is a cross-sectional view illustrating still another exemplary embodiment of a functional member constructed according to principles of the invention.

FIG. 11 is a cross-sectional view illustrating still another exemplary embodiment of a functional member constructed according to principles of the invention. Descriptions of elements of the functional layer 4800 described with reference to FIG. 11, which are substantially the same as or similar to those of the functional layer 800 described with reference to FIG. 7, will not be repeated to avoid redundancy.

Referring to FIG. 11, in an exemplary embodiment, the functional layer 4800 may include a first functional layer 4810, a first filler 4815, a second functional layer 4820, and a third functional layer 4830. The second functional layer 4820 may be disposed on a first surface 4811 of the first functional layer 4810, and the third functional layer 4830 may be disposed on a second surface 4812 of the first functional layer 4810 opposite to the first surface 4811. In other words, the first functional layer 4810 may be disposed between the second functional layer 4820 and the third functional layer 4830.

In an exemplary embodiment, the elastic modulus of the second functional layer 4820 and the elastic modulus of the third functional layer 4830 may be greater than the elastic modulus of the first functional layer 4810. For example, the elastic modulus of the second functional layer 4820 and the elastic modulus of the third functional layer 4830 may be greater than the elastic modulus of the first functional layer 4810 and less than the elastic modulus of the first filler 4815.

Figure 12:
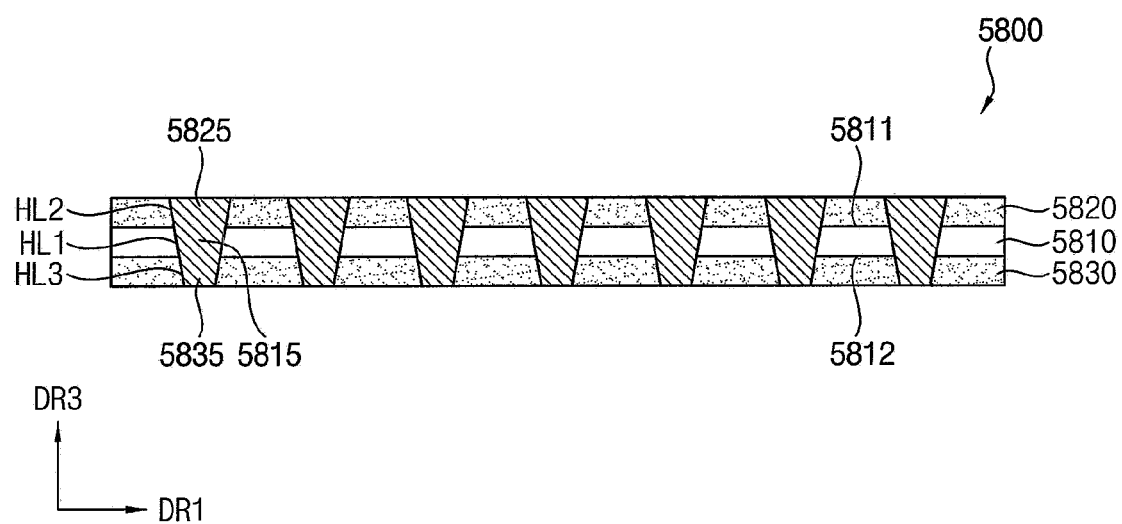
FIG. 12 is a cross-sectional view illustrating a still further exemplary embodiment of a functional member constructed according to principles of the invention.

FIG. 12 is a cross-sectional view illustrating a still further exemplary embodiment of a functional member constructed according to principles of the invention. Descriptions of elements of the functional layer 5800 described with reference to FIG. 12, which are substantially the same as or similar to those of the functional layer 4800 described with reference to FIG. 11, will not be repeated to avoid redundancy.

Referring to FIG. 12, in an exemplary embodiment, the functional layer 5800 may include a first functional layer 5810, a first filler 5815, a second functional layer 5820, a second filler 5825, a third functional layer 5830, and a third filler 5835. A plurality of second holes HL2 may be formed in the second functional layer 5820, and the second filler 5825 may fill each of the second holes HL2. A plurality of third holes HL3 may be formed in the third functional layer 5830, and the third filler 5835 may fill each of the third holes HL3. Accordingly, the functional layer 5800 may include the first functional layer 5810, a plurality of first fillers 5815 respectively filling the first holes HL1, the second functional layer 5820, a plurality of second fillers 5825 respectively filling the second holes HL2, the third functional layer 5830, and a plurality of third fillers 5835 respectively filling the third holes HL3.

The elastic modulus of the second filler 5825 and the elastic modulus of the third filler 5835 may be greater than the elastic modulus of the second functional layer 5820 and the elastic modulus of the third functional layer 5830, respectively. In an exemplary embodiment, the elastic modulus of the second functional layer 5820 and the elastic modulus of the third functional layer 5830 may be less than about 1 GPa, and the elastic modulus of the second filler 5825 and the elastic modulus of the third filler 5835 may be greater than or equal to about 1 GPa. For example, the elastic modulus of the second filler 5825 and the elastic modulus of the third filler 5835 may be substantially equal to the elastic modulus of the first filler 5815.

In an exemplary embodiment, the first hole HL1, the second hole HL2, and the third hole HL3 may be integrally formed. In such an exemplary embodiment, the first filler 5815, the second filler 5825, and the third filler 5835 may be integrally formed.

Figure 13:
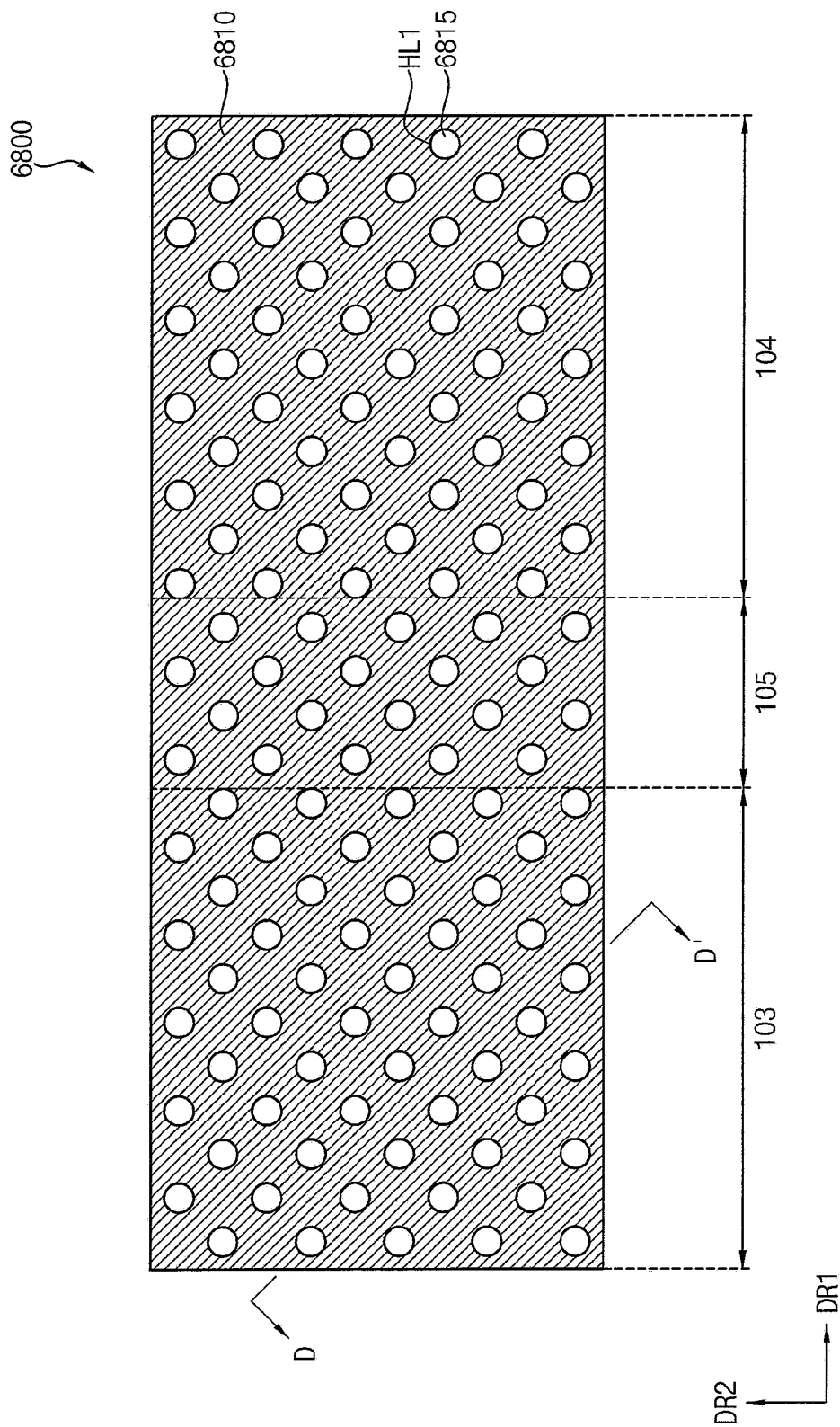
FIG. 13 is a plan view illustrating yet another exemplary embodiment of a functional member constructed according to principles of the invention.
Figure 14:
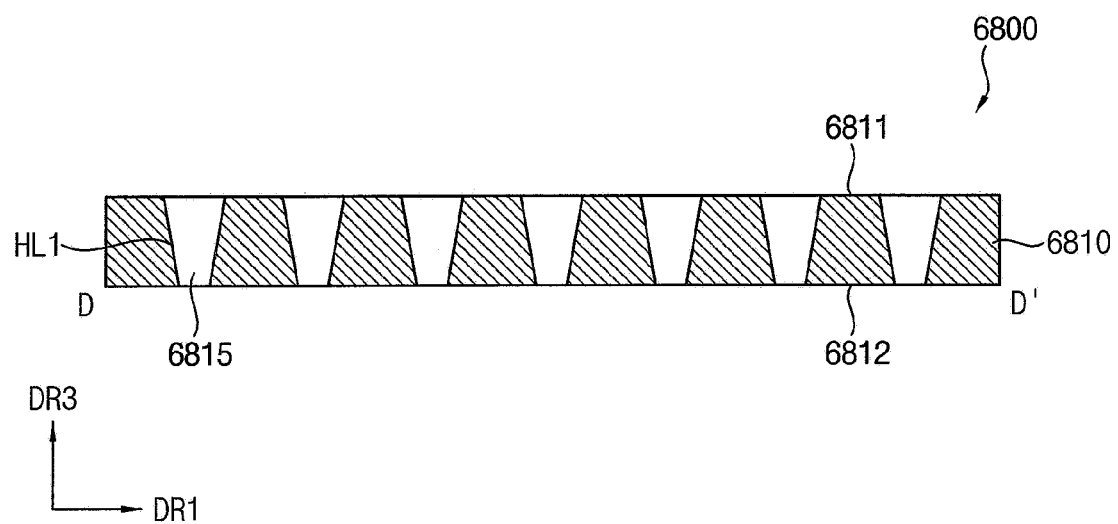
FIG. 14 is a cross-sectional view taken along a line D-D' of FIG. 13.

Hereinafter, a functional layer 6800 according to an exemplary embodiment will be described with reference to FIGS. 13 and 14. FIG. 13 is a plan view illustrating yet another exemplary embodiment of a functional member constructed according to principles of the invention. FIG. 14 is a cross-sectional view taken along a line D-D' of FIG. 13. Descriptions of elements of the functional layer 6800 described with reference to FIGS. 13 and 14, which are substantially the same as or similar to those of the functional layer 800 described with reference to FIGS. 6 and 7, will not be repeated to avoid redundancy.

Referring to FIGS. 13 and 14, the functional layer 6800 may include a first functional layer 6810 and a first filler 6815. A plurality of first holes HL1 may be formed in the first functional layer 6810, and the first filler 6815 may fill each of the first holes HL1. Accordingly, the functional layer 6800 may include the first functional layer 6810 and a plurality of first fillers 6815 respectively filling the first holes HL1.

The elastic modulus of the first filler 6815 may be less than the elastic modulus of the first functional layer 6810. In other words, the first functional layer 6810 may have a relatively high elastic modulus, and the first filler 6815 may have a relatively low elastic modulus. In an exemplary embodiment, the elastic modulus of the first functional layer 6810 may be greater than or equal to about 1 GPa, and the elastic modulus of the first filler 6815 may be less than about 1 GPa. Buckling or delamination of the functional layer 6800 may be reduced or prevented when the functional layer 6800 includes only the first functional layer 6810 because the elastic modulus of the first functional layer 6810 is relatively high, however, when external impact is applied to the foldable display device, the external impact may be transferred to the display panel due to the decrease of an impact resistance of the functional layer 6800. However, in the illustrated exemplary embodiments, because the functional layer 6800 includes the first filler 6815 filling each of the first holes HL1 of the first functional layer 6810 and having a relatively low elastic modulus, the functional layer 6800 may prevent the external impact from being transferred to the display panel although the external impact is applied to the foldable display device.

The foldable display device according to some exemplary embodiments may be applied to a display device included in a computer, a notebook, a mobile phone, a smartphone, a smart pad, a PMP, a PDA, an MP3 player, or the like.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A foldable display device, comprising:
a display panel;
a window disposed on the display panel; and
a functional member having an elastic modulus and being disposed between the display panel and the window or at least partially on the window, the functional member including a plurality of first discontinuities having a greater elastic modulus than the elastic modulus of the functional member.

2. The foldable display device of claim 1, wherein the elastic modulus of the functional member is less than about 1 GPa, wherein the elastic modulus of the first discontinuities is greater than or equal to about 1 GPa.

3. The foldable display device of claim 1, wherein at least one of the functional member and the first discontinuities include a light transmitting material.

4. The foldable display device of claim 1, wherein the functional member comprises at least one of a polyamide and a polyurethane.

5. The foldable display device of claim 1, wherein the first discontinuities comprise poly(methyl methacrylate).

6. The foldable display device of claim 1, wherein the first discontinuities comprise first holes having a material therein.

7. The foldable display device of claim 6, wherein the first holes have a generally circular shape in a plan view with a diameter ranging from about 4 μm to about 100 μm.

8. The foldable display device of claim 6, wherein at least some of the first holes have a generally trapezoidal shape in a cross-sectional view.

9. The foldable display device of claim 1, wherein at least some of the first discontinuities comprise through holes passing through the functional member.

10. The foldable display device of claim 1, wherein at least some of the first discontinuities comprise recessed holes extending from a surface of the functional member.

11. The foldable display device of claim 1, wherein the display panel includes a first non-bendable portion, a second non-bendable portion, and a bendable portion between the first non-bendable portion and the second non-bendable portion, and
wherein the first discontinuities overlap the first non-bendable portion, the second non-bendable portion, and the bendable portion.

12. The foldable display device of claim 1, wherein the functional member further comprises a first functional layer having the first discontinuities, a second functional layer having an elastic modulus and being at least partially disposed on the first functional layer, the second functional layer having a plurality of second discontinuities, and a third functional layer disposed between the first functional layer and the second functional layer, and
wherein the second discontinuities have an elastic modulus greater than the elastic modulus of the second functional layer.

13. The foldable display device of claim 12, wherein the third functional layer has an elastic modulus greater than the elastic modulus of the first functional layer and the elastic modulus of the second functional layer.

14. The foldable display device of claim 12, wherein a plurality of third discontinuities are formed in the third functional layer, the third discontinuities having an elastic modulus greater than an elastic modulus of the third functional layer.

15. The foldable display device of claim 12, wherein the third functional layer comprises a polyimide.

16. The foldable display device of claim 1, wherein the functional member further comprises a first functional layer having the first discontinuities, a second functional layer having an elastic modulus and being at least partially disposed on a first surface of the first functional layer, and a third functional layer having an elastic modulus and being at least partially disposed on a second surface of the first functional layer opposite to the first surface, and
wherein the elastic modulus of the second functional layer and the elastic modulus of the third functional layer are greater than the elastic modulus of the first functional layer.

17. The foldable display device of claim 16, wherein a plurality of second discontinuities having an elastic modulus and a plurality of third discontinuities having an elastic modulus are respectively disposed in the second functional layer and the third functional layer,
and
wherein the elastic modulus of the second discontinuities and the elastic modulus of the third discontinuities are greater than the elastic modulus of the second functional layer and the elastic modulus of the third functional layer, respectively.

18. The foldable display device of claim 1, wherein the functional member comprises an impact absorbing layer disposed between the display panel and the window.

19. The foldable display device of claim 1, wherein the functional member comprises a protective layer disposed on the window.

20. A foldable display device, comprising:
a display panel;
a window disposed on the display panel; and
a functional member having an elastic modulus and being disposed between the display panel and the window or on the window, the functional member having a plurality of holes and a filler disposed in at least some of the holes,
wherein the filler has an elastic modulus smaller than the elastic modulus of the functional member.

* * * * *